United States Patent
Lee et al.

(10) Patent No.: US 10,862,015 B2
(45) Date of Patent: Dec. 8, 2020

(54) SEMICONDUCTOR LIGHT EMITTING DEVICE PACKAGE

(71) Applicant: SAMSUNG ELECTRONICS CO., LTD., Suwon-si (KR)

(72) Inventors: In Hyung Lee, Hanam-si (KR); Sung Min Jang, Suwon-si (KR); Soon Won Jeong, Hwaseong-si (KR)

(73) Assignee: SAMSUNG ELECTRONICS., LTD., Suwon-si (KR)

( * ) Notice: Subject to any disclaimer, the term of this patent is extended or adjusted under 35 U.S.C. 154(b) by 0 days.

(21) Appl. No.: 16/188,777

(22) Filed: Nov. 13, 2018

(65) Prior Publication Data

US 2019/0280176 A1   Sep. 12, 2019

(30) Foreign Application Priority Data

Mar. 8, 2018  (KR) .................. 10-2018-0027585
Jun. 8, 2018  (KR) .................. 10-2018-0066316

(51) Int. Cl.
| | |
|---|---|
| H01L 33/00 | (2010.01) |
| H01L 33/62 | (2010.01) |
| H01L 33/40 | (2010.01) |
| H01L 33/52 | (2010.01) |
| H01L 33/50 | (2010.01) |

(52) U.S. Cl.
CPC ............ *H01L 33/62* (2013.01); *H01L 33/405* (2013.01); *H01L 33/50* (2013.01); *H01L 33/52* (2013.01)

(58) Field of Classification Search
CPC ....... H01L 33/62; H01L 33/405; H01L 33/50; H01L 33/52

USPC ............................................ 257/81, 98, 100
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |

(Continued)

FOREIGN PATENT DOCUMENTS

| | | |
|---|---|---|
| JP | 2015-041683 | 3/2015 |
| JP | 2016-039321 | 3/2016 |

(Continued)

*Primary Examiner* — Tan N Tran
(74) *Attorney, Agent, or Firm* — F. Chau & Associates, LLC

(57) ABSTRACT

A semiconductor light emitting device package includes a lead frame structure including a first lead frame and a second lead frame. A resin portion is adjacent to side surfaces of the first lead frame and the second lead frame. A semiconductor light-emitting device is mounted on the first lead frame and the second lead frame, in the form of a flip chip, by eutectic bonding. Each of the first lead frame and the second lead frame has a plurality of first grooves extended in a first direction.

20 Claims, 11 Drawing Sheets

(56) References Cited

U.S. PATENT DOCUMENTS

| | | |
|---|---|---|
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 8,987,022 B2 * | 3/2015 | Yoo ............... H01L 33/486 438/27 |
| 9,570,664 B2 * | 2/2017 | Oh ................ H01L 33/60 |
| 10,297,725 B2 * | 5/2019 | Kim ............... H01L 33/56 |
| 10,326,056 B2 * | 6/2019 | Jung .............. H01L 33/42 |
| 2005/0199884 A1 | 9/2005 | Lee et al. |
| 2011/0210354 A1 | 9/2011 | Ichikawa et al. |
| 2014/0329346 A1 | 11/2014 | Ooyabu et al. |
| 2017/0092830 A1 | 3/2017 | Oda et al. |
| 2017/0103966 A1 | 4/2017 | Choi et al. |
| 2017/0155026 A1 | 6/2017 | Bergmann et al. |
| 2018/0006203 A1 * | 1/2018 | Liu ............... H01L 33/62 |

FOREIGN PATENT DOCUMENTS

| | | |
|---|---|---|
| KR | 101096639 | 12/2011 |
| KR | 1020170043118 | 4/2017 |
| KR | 101810494 | 12/2017 |

* cited by examiner

A-A'

B-B'

SEMICONDUCTOR LIGHT EMITTING DEVICE PACKAGE

CROSS-REFERENCE TO RELATED APPLICATIONS

This application claims priority under 35 U.S.C. § 119 to Korean Patent Application No. 10-2018-0027585 filed on Mar. 8, 2018 in the Korean Intellectual Property Office, the disclosure of which is incorporated by reference herein in its entirety, and Korean Patent Application No. 10-2018-0066316 filed on Jun. 8, 2018 in the Korean Intellectual Property Office, the disclosure of which is incorporated by reference herein in its entirety.

TECHNICAL FIELD

Exemplary embodiments of the present inventive concept relate to a semiconductor device, and more particularly, to a semiconductor light emitting device package.

DISCUSSION OF RELATED ART

A semiconductor light-emitting device is known as a next-generation light source having a relatively long lifespan, relatively low power consumption, a relatively quick response speed, and environmental friendliness. The semiconductor light emitting device has attracted attention as a light source in various products, such as a lighting device, a display device, or automotive lighting. However, manufacturing costs of semiconductor light emitting devices may be relatively high.

SUMMARY

An exemplary embodiment of the present inventive concept provides a semiconductor light emitting device package having relatively low manufacturing costs and increased reliability.

According to an exemplary embodiment of the present inventive concept, a semiconductor light emitting device package includes a lead frame structure including a first lead frame and a second lead frame. A resin portion is adjacent to side surfaces of the first lead frame and the second lead frame. A semiconductor light-emitting device is mounted on the first lead frame and the second lead frame, in the form of a flip chip. Each of the first lead frame and the second lead frame has a plurality of first grooves extended in a first direction.

According to an exemplary embodiment of the present inventive concept, a semiconductor light emitting device package includes a lead frame structure including a first lead frame and a second lead frame. A resin portion is adjacent to side surfaces of the first lead frame and the second lead frame. A semiconductor light-emitting device mounted on the lead frame structure, in the form of a flip chip. The semiconductor light-emitting device includes a first bonding layer and a second bonding layer, connected to the first lead frame and the second lead frame, respectively. A phosphor layer is disposed on an upper surface of the semiconductor light-emitting device. An encapsulation portion is disposed on a side surface of the phosphor layer and a side surface of the semiconductor light-emitting device. The encapsulation portion is disposed on the lead frame structure. Each of the first lead frame and the second lead frame has a plurality of first grooves extended in-parallel with each other in a first direction.

According to an exemplary embodiment of the present inventive concept, a semiconductor light emitting device package includes a lead frame structure including a first lead frame and a second lead frame. A resin portion is disposed on side surfaces of the first lead frame and the second lead frame. A semiconductor light-emitting device is mounted in the lead frame structure, in the form of a flip chip. The semiconductor light-emitting device includes a first bonding layer and a second bonding layer in contact with the first lead frame and the second lead frame, respectively. A phosphor layer is disposed on an upper surface of the semiconductor light-emitting device. An encapsulation portion is disposed on a side surface of the phosphor layer and a side surface of the semiconductor light-emitting device. The encapsulation portion is disposed on the lead frame structure. Each of the first lead frame and the second lead frame has a plurality of first grooves extended in-parallel with each other in a first direction. The resin portion includes a silicon molding compound.

BRIEF DESCRIPTION OF DRAWINGS

The above and other features of the inventive concept will become more apparent by describing in detail exemplary embodiments thereof, with reference to the accompanying drawing, in which.

DETAILED DESCRIPTION

Figure 1:
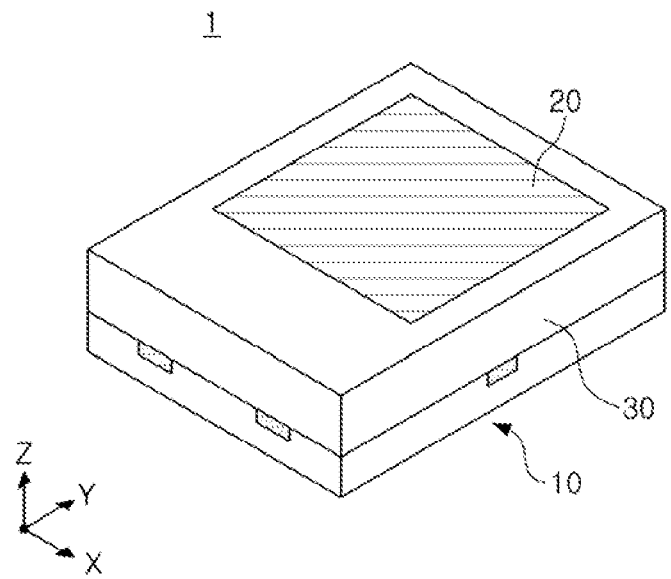
FIG. 1 is a perspective view of a semiconductor light emitting device package according to an exemplary embodiment of the present inventive concept.

Exemplary embodiments of the present inventive concept will be described below in more detail with reference to the accompanying drawings. In this regard, the exemplary embodiments may have different forms and should not be construed as being limited to the exemplary embodiments of the present inventive concept described herein. Like reference numerals may refer to like elements throughout the specification and drawings.

Figure 2:
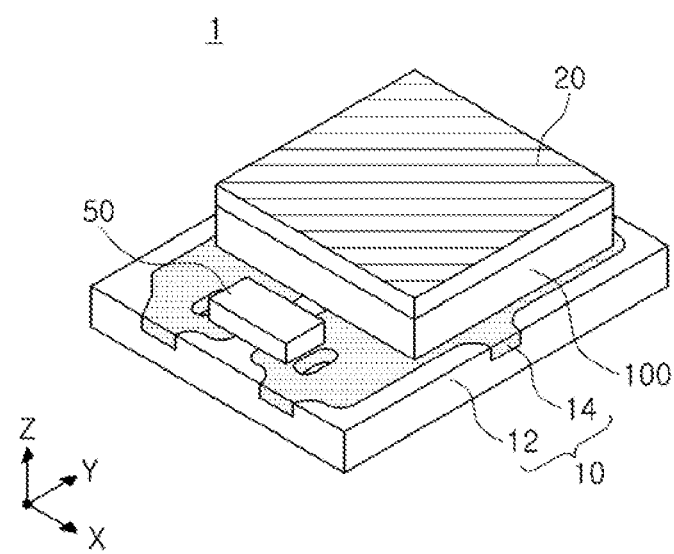
FIG. 2 is a perspective view of the semiconductor light emitting device package of FIG. 1 from which a portion is omitted.
Figure 3:
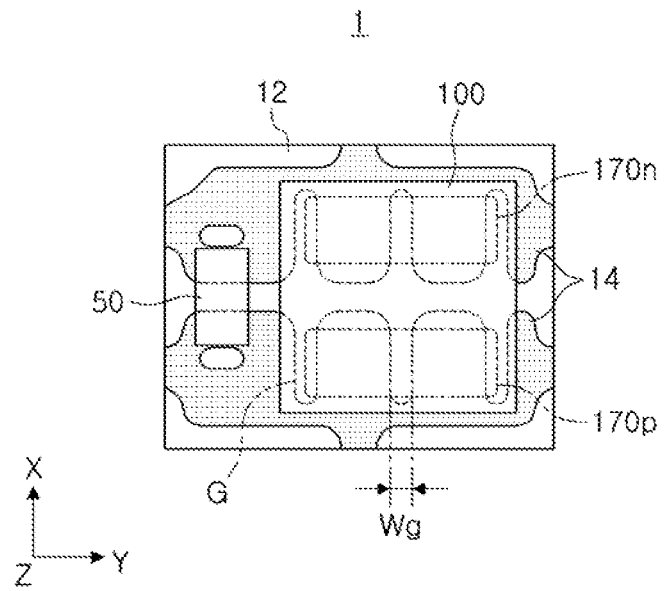
FIG. 3 is a plan view of a semiconductor light emitting device package according to an exemplary embodiment of the present inventive concept.

FIG. 1 is a perspective view of a semiconductor light emitting device package according to an exemplary embodiment of the present inventive concept. FIG. 2 is a perspective view of the semiconductor light emitting device package of FIG. 1 which a portion is omitted. FIG. 3 is a plan view of a semiconductor light emitting device package according to an exemplary embodiment of the present inventive concept.

Referring to FIGS. 1 to 3, a semiconductor light emitting device package 1 may include a lead frame structure 10, a semiconductor light-emitting device 100, a phosphor layer 20, and an encapsulation portion 30.

The lead frame structure 10 may include at least one lead frame 14 (e.g., a pair of lead frames 14) and a resin portion 12. As an example, the lead frames 14 may include a first lead frame and a second lead frame spaced apart from each other along the first direction (e.g., the X direction) (see, e.g., FIG. 3). The resin portion 12 may be adjacent to side surfaces of the lead frames 14. For example, the resin portion 12 may be disposed on side surfaces of the lead frames 14 and may substantially surround the side surfaces of the lead frames 14. The resin portion 12 may include, for example, a silicone molding compound (SMC). The lead frames 14 may include, for example, copper (Cu). The lead frame structure 10 may be referred to as a package substrate. Each of the lead frames 14 may have a plurality of grooves G. The plurality of grooves G may extend in a first direction (e.g., an X direction). The grooves of the plurality of grooves G may extend substantially in-parallel with each other. The grooves G may be arranged at substantially regular intervals in a second direction (e.g., a Y direction). The second direction (e.g., the Y direction) may be perpendicular to the first direction (e.g., the X direction). Widths Wg of the groves G may be substantially equal to each other. For example, in the second direction (e.g., the Y direction), widths Wg of the grooves G may be substantially equal to each other.

As an example, the first direction X may be perpendicular to the second direction Y. The first direction X and the second direction Y may define a plane along which the semiconductor light-emitting device package extends. A third direction Z may be perpendicular to the first and second directions X and Y. Thus, the third direction Z may be orthogonal to the plane extending in the first and second directions X and Y.

The semiconductor light-emitting device 100 may be mounted on the lead frames 14, in the form of a flip chip. The semiconductor light-emitting device 100 may be mounted on the lead frames 14 using eutectic bonding. For the eutectic bonding, the semiconductor light-emitting device 100 may include bonding layers 170n and 170p, including, for example, an eutectic alloy (for example, an AuSn alloy), while the lead frames 14 may include a plating layer having a multilayer structure and including, for example, nickel (Ni)/palladium (Pd)/gold (Au). The semiconductor light-emitting device 100 may emit, for example, blue light or ultraviolet light.

The semiconductor light-emitting device 100 may be mounted in a position in which the semiconductor light-emitting device 100 overlaps the grooves G (e.g., along the Z direction). When a size of the semiconductor light-emitting device 100 is relatively small, the semiconductor light-emitting device may be mounted in a position in which the semiconductor light-emitting device overlaps a portion of the grooves G (e.g., along the Z direction). Edges of the bonding layers 170n and 170p of the semiconductor light-emitting device 100 may overlap the grooves G. First edges of the bonding layers 170n and 170p, located at opposite ends in the second direction (e.g., the Y direction), may overlap outer grooves G disposed outside, among the grooves G along the third direction (e.g., the Z direction) orthogonal to the first and second directions. A portion of second edges of the bonding layers 170n and 170p, located at opposite ends in the first direction (e.g., the X direction), may overlap the grooves G along the third direction (e.g., the Z direction) orthogonal to the first and second directions. The bonding layers 170n and 170p may be spaced apart from each other.

The phosphor layer 20 may be disposed on and may be attached to an upper surface of the semiconductor light-emitting device 100. The phosphor layer 20 may include a fluorescent film in which phosphor powder particles are mixed with a resin (for example, silicone resin). The phosphor powder particles may be, for example, yellow phosphor powder particles.

The encapsulation portion 30 may be disposed on the lead frame structure 10 and may expose an upper surface of the phosphor layer 20, while surrounding side surfaces of the semiconductor light-emitting device 100. A size of the encapsulation portion 30 in a first direction (e.g., the X direction) and a size thereof in a second direction (e.g., the Y direction) may be substantially equal to a size of the lead frame structure 10. Side surfaces of the encapsulation portion 30 may be substantially coplanar with side surfaces of the lead frame structure 10. The encapsulation portion 30 may include, for example, silicone resin including $TiO_2$ powder.

The semiconductor light emitting device package 1 may include a zener diode 50, disposed on a side of the semiconductor light-emitting device 100, and mounted on the lead frames 14. The encapsulation portion 30 may completely cover the zener diode 50. The zener diode 50 may be a unidirectional zener diode or a bidirectional zener diode. The zener diode 50 may be mounted on the lead frames 14, for example, using eutectic bonding. The semiconductor light-emitting device 100 and the zener diode 50 may be connected to each other (e.g., in-parallel).

A thickness of the semiconductor light emitting device package 1 (e.g., along the Z direction), may be, for example, 0.46 mm. A thickness of the lead frame structure 10 may be, for example, 0.20 mm.

According to an exemplary embodiment of the present inventive concept, as compared with a semiconductor light emitting device package, in which a ceramic substrate (AlN, $Al_2O_3$, or the like) is used as a package substrate, and a ceramic phosphor plate (CPP) is used for wavelength conversion, the semiconductor light emitting device package 1 may be manufactured at relatively low manufacturing costs. The lead frames 14 may include a plurality of grooves G, and thus thermal stress due to a difference in thermal expansion coefficients between the lead frame structure 10 and the semiconductor light-emitting device 100 may be reduced or eliminated, thus increasing reliability of a semiconductor light emitting device package. Moreover, without using solder, the semiconductor light-emitting device 100 may be directly mounted in the lead frame 14 using eutectic bonding (e.g., using AuSn). Thus, while the semiconductor light emitting device package 1 is used, an occurrence of remelting of the solder may be eliminated. In addition, in the semiconductor light emitting device package 1 not including an epoxy resin, an occurrence of yellowing may be eliminated.

A process in which the semiconductor light-emitting device 100 is mounted on the lead frame structure 10 using eutectic bonding will be described in more detail below. In an exemplary embodiment of the present inventive concept, without heating the lead frame structure 10 having a thermal expansion coefficient larger than that of the semiconductor light-emitting device 100, the semiconductor light-emitting device 100 is raised using a vacuum suction method with a heated collet, and the semiconductor light-emitting device 100 is heated. Then, the semiconductor light-emitting device 100 is disposed on the lead frame structure 10. The bonding layers 170n and 170p of the semiconductor light-emitting device 100, having been heated, are melted, and eutectic bonding with a plating layer of the lead frame 14 of the lead frame structure 10 is provided. Using such a mounting process, thermal stress generated due to the difference in thermal expansion coefficients between the semiconductor light-emitting device 100 and the lead frame structure 10 may be reduced or eliminated.

Figure 4:
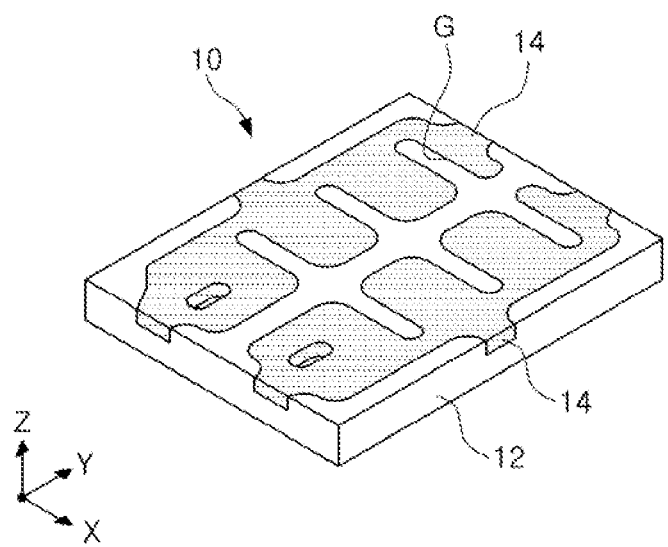
FIG. 4 is a perspective view of a lead frame structure according to an exemplary embodiment of the present inventive concept.
Figure 5:
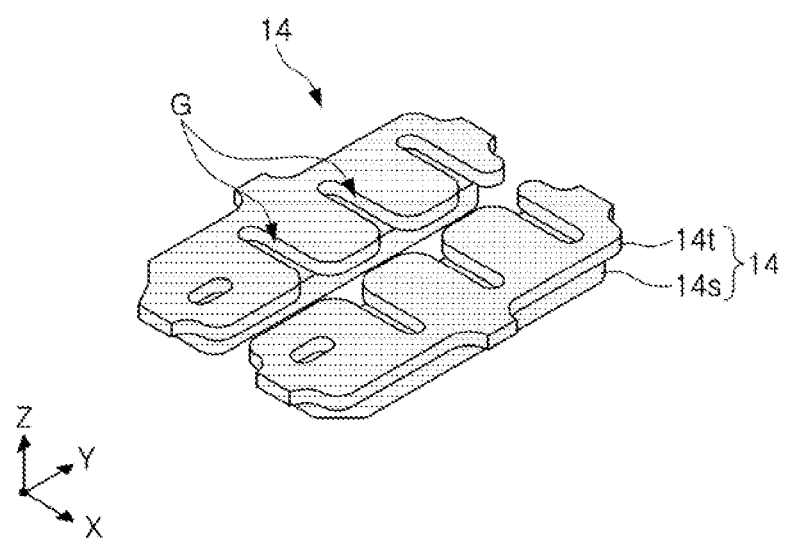
FIG. 5 is a perspective view of a lead frame according to an exemplary embodiment of the present inventive concept.
Figure 6:
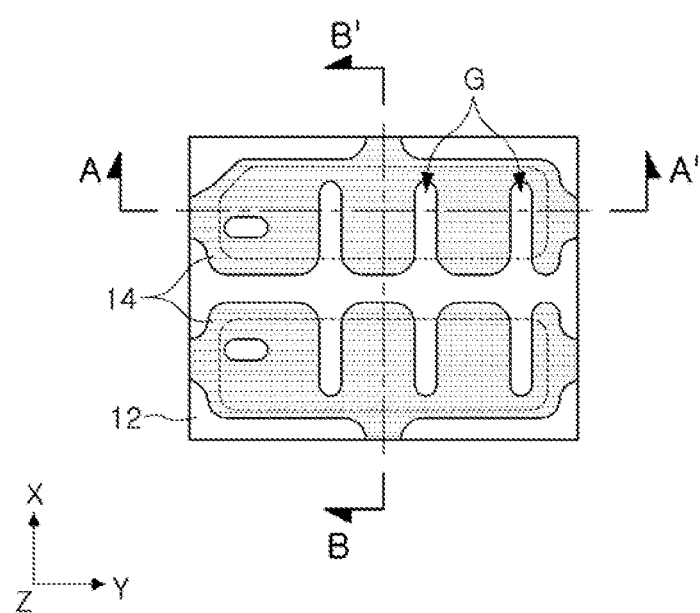
FIG. 6 is a plan view of a lead frame structure according to an exemplary embodiment of the present inventive concept.
Figure 7A:
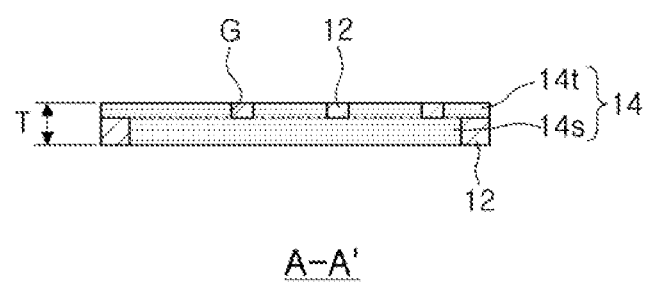
FIGS. 7A and 7B are cross-sectional views taken along line A-A' and line B-B' of FIG. 6, respectively.
Figure 7B:
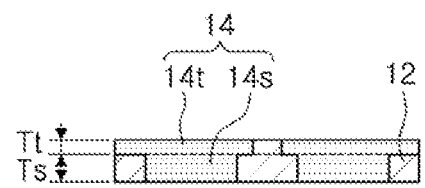

FIG. 4 is a perspective view of a lead frame structure according to an exemplary embodiment of the present inventive concept. FIG. 5 is a perspective view of a lead frame according to an exemplary embodiment of the present inventive concept. FIG. 6 is a plan view of a lead frame structure according to an exemplary embodiment of the present inventive concept. FIGS. 7A and 7B are cross-sectional views taken along line A-A' and line B-B' of FIG. 6, respectively.

Referring to FIGS. 4, 5, 6, 7A, and 7B, the lead frame structure 10 may include a pair of lead frames 14 and the resin portion 12. The lead frame structure 10 may have an upper surface which is substantially flat. Upper surfaces of the lead frames 14 may be substantially coplanar with an upper surface of the resin portion 12. The lead frame structure 10 may have a lower surface which is substantially flat. Lower surfaces of the lead frames 14 may be substantially coplanar with a lower surface of the resin portion 12.

Each of the lead frames 14 may have a plurality of grooves G (e.g., three grooves G). The grooves G may extend in the first direction (e.g., the X direction). The grooves G may extend substantially in-parallel with each other. The grooves G may be extended in the first direction (e.g., the X direction), such as in-parallel with each other. An extension length of the grooves G may be smaller than a width of the lead frame 14. Extension lengths of the grooves G may be substantially equal to each other. In an exemplary embodiment of the present inventive concept, an extension length of at least one of the grooves G may be shorter than extension lengths of other grooves of the grooves G. For example, a length of a intermediate groove G, located in the middle of the three grooves G, may be shorter than lengths of two outer grooves G, located adjacent to the intermediate groove G of the three grooves G. The grooves G may be extended from an inner side surface of the lead frame 14 toward an outer side surface thereof. Here, the inner side surface is referred to as a side surface in which a pair of lead frames 14 face each other, and the outer side surface is referred to as a side surface opposite the inner side surface. The grooves G may be spaced apart from each other in a second direction (e.g., the Y direction). The grooves G may be arranged at substantially regular intervals in the second direction (e.g., the Y direction).

A width of the lead frame 14 may refer to a size of the lead frame 14 in the first direction (e.g., the X direction), a length of the lead frame 14 may refer to a size of the lead frame 14 in the second direction (e.g., the Y direction), and a thickness of the lead frame 14 may refer to a size of the lead frame 14 in a third direction (e.g., the Z direction). Thus, the first direction (e.g., the X direction) may be a width direction, the second direction (e.g., the Y direction) may be a length direction, and the third direction (e.g., the Z direction) may be a thickness direction.

Each of the lead frames 14 may have an upper region 14t and a lower region 14s, and a width and a length of the lower region 14s may be smaller than a width and a length of the upper region 14t. The grooves G may be formed on the upper region 14t. A depth of the grooves G may be equal to a thickness Tt of the upper region 14t. The grooves G may be substantially filled with the resin portion 12. An upper surface of the resin portion 12, with which the grooves G are filled, may be substantially coplanar with an upper surface of the lead frames 14. For example, the upper surface of the resin portion 12, with which the grooves G are filled, may be substantially coplanar with an upper surface of the upper region 14t.

A thickness Tt of the upper region 14t of the lead frame 14 may be less than a thickness Ts of the lower region 14s of the lead frame 14. A total thickness T of the lead frame structure 10 may be, for example, 0.2 mm, the thickness Tt of the upper region 14t of the lead frame 14 may be, for example, 0.07 mm, and the thickness Ts of the lower region 14s of the lead frame 14 may be, for example, 0.13 mm.

Figure 8:
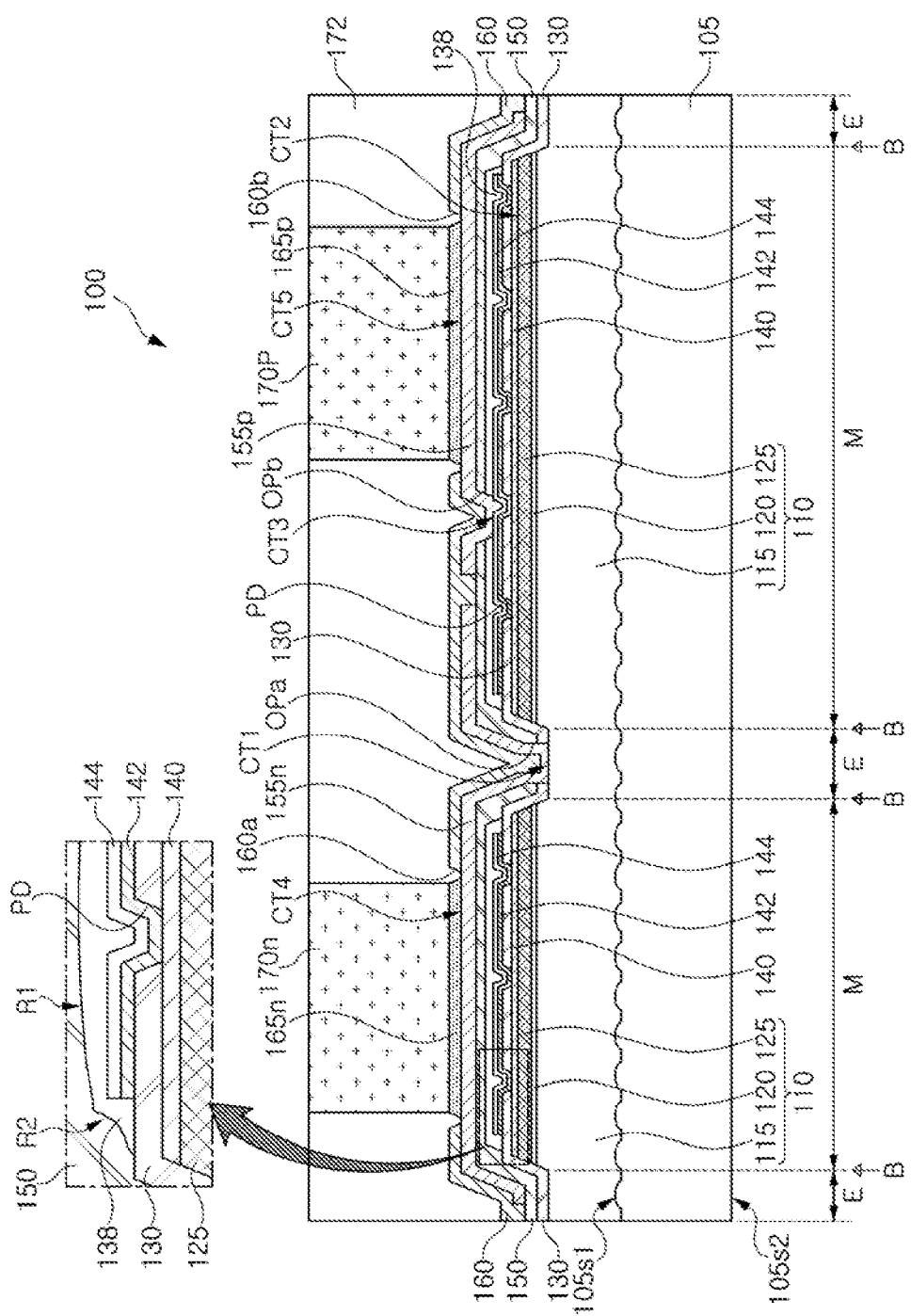
FIG. 8 is a cross-sectional view of a semiconductor light-emitting device according to an exemplary embodiment of the present inventive concept.

FIG. 8 is a cross-sectional view of a semiconductor light-emitting device according to an exemplary embodiment of the present inventive concept.

Referring to FIG. 8, the semiconductor light-emitting device 100 according to an exemplary embodiment of the present inventive concept may include a substrate 105, a light emitting structure 110, a first insulating layer 130, a second insulating layer 150, a third insulating layer 160, a first transparent electrode layer 140, a second transparent electrode layer 142, a reflective electrode layer 144, a transparent protective layer 138, a first connecting electrode 155n, a second connecting electrode 155p, a first electrode pad 165n, a second electrode pad 165p, the first bonding layer 170n, and the second bonding layer 170p.

The semiconductor light-emitting device 100 may be mounted on a package substrate, in the form of a flip chip using eutectic bonding.

The substrate 105 may have a front surface 105s1 and a rear surface 105s2, opposite the front surface 105s1. The substrate 105 may be a substrate for semiconductor growth, and may include an insulating, conductive, or semiconductor material, such as sapphire, Si, SiC, $MgAl_2O_4$, MgO, $LiAlO_2$, $LiGaO_2$, or GaN. The sapphire may be used as a substrate for nitride semiconductor growth.

Throughout the specification, terms such as "front surface" and "rear surface" may be used to identify the relative position in components, and exemplary embodiments of the present inventive concept are not limited by these terms. Accordingly, the terms such as "front surface" and "rear surface" may be replaced by terms such as "first surface" and "second surface", and the like, or "upper surface" and "lower surface", and may be used to describe various components herein. Thus, the front surface 105s1 and the rear surface 105s2 of the substrate 105 may be interchangeably referred to as an upper surface 105s1 and a lower surface 105s2 of the substrate 105, or may be interchangeably referred to as a first surface 105s1 and a second surface 105s2 of the substrate 105.

The light emitting structure 110 may be disposed on the front surface 105s1 of the substrate 105.

According to an exemplary embodiment of the present inventive concept, the front surface 105s1 of the substrate 105 may be provided to have a concave-convex structure, and the concave-convex structure may increase the crystallinity and light emission efficiency of semiconductor layers, forming the light emitting structure 110. In an exemplary embodiment of the present inventive concept, the concave-convex structure of the front surface 105s1 of the substrate 105 may have a dome-shaped shape, which is convex, by way of example, but exemplary embodiments of the present inventive concept are not limited thereto. For example, the concave-convex structure of the front surface 105s1 of the substrate 105 may be provided in various forms, such as a quadrangular shape, or a triangular shape. The concave-convex structure of the front surface 105s1 of the substrate 105 may be selectively provided, or may be omitted.

In an exemplary embodiment of the present inventive concept, the substrate 105 may be removed. For example, the substrate 105 may be provided as a substrate for growth for growing the light emitting structure 110, and may then be removed through a separation process. The substrate 105 may be separated from the light emitting structure 110 using a laser lift off (LLO) process, or a chemical lift off (CLO) process.

A buffer layer may be provided on the front surface 105s1 of the substrate 105. The buffer layer may be provided for lattice defect relaxation of a semiconductor layer, grown on the substrate 105, and may be formed of an undoped semiconductor layer formed of nitride, for example. Undoped GaN, AlN, or InGaN may be applied to the buffer layer, and may grow to a thickness of tens to hundreds of Å at a relatively low temperature of from about 500° C. to about 600° C. to provide the buffer layer. Herein, the term "undoped" may indicate that an impurity doping process is not separately performed on a semiconductor layer. However, such a buffer layer may be omitted according to an exemplary embodiment of the present inventive concept.

The light emitting structure 110 may include a first conductivity-type semiconductor layer 115, an active layer 120, and a second conductivity-type semiconductor layer 125.

The first conductivity-type semiconductor layer 115 may grow from the front surface 105s1 of the substrate 105 to be provided thereon. The first conductivity-type semiconductor layer 115 may include a semiconductor doped with an n-type impurity, and may be an n-type nitride semiconductor layer. When viewed in a plan view (e.g., along the Z direction), the first conductivity-type semiconductor layer 115 may have a quadrangular shape.

The second conductivity-type semiconductor layer 125 may include a semiconductor doped with a p-type impurity, and may be a p-type nitride semiconductor layer.

In an exemplary embodiment of the present inventive concept, the first conductivity-type semiconductor layer 115 and the second conductivity-type semiconductor layer 125 may be stacked. Positions of the first conductivity-type semiconductor layer 115 and the second conductivity-type semiconductor layer 125 may be changed (e.g., reversed). The first conductivity-type semiconductor layer 115 and the second conductivity-type semiconductor layer 125 may each have an empirical formula of $Al_xIn_yGa_{(1-x-y)}N$ (where $0 \le x<1$, $0 \le y<1$, and $0 \le x+y<1$), which corresponds to a material such as GaN, AlGaN, InGaN, or AlInGaN.

The active layer 120 may be disposed between the first conductivity-type semiconductor layer 115 and the second conductivity-type semiconductor layer 125. The active layer 120 may emit light having a predetermined energy by the recombination of electrons and holes at the time of operation of the semiconductor light-emitting device 100. The active layer 120 may include a material having an energy band gap less than that of the first conductivity-type semiconductor layer 115 and the second conductivity-type semiconductor layer 125. For example, when the first conductivity-type semiconductor layer 115 and the second conductivity-type semiconductor layer 125 are a GaN-based compound semiconductor, the active layer 120 may include an InGaN-based compound semiconductor having an energy band gap less than that of GaN. As an example, the active layer 120 may have a multiple quantum well (MQW) structure in which quantum well layers and quantum barrier layers are alternately stacked on each other, for example, an InGaN/GaN structure. However, the active layer 120 is not limited thereto, and may also have a single quantum well (SQW) structure.

The light emitting structure 110 may include a recess region E in which the second conductivity-type semiconductor layer 125, the active layer 120, and a portion of the first conductivity-type semiconductor layer 115 are etched, and a mesa region M around the recess region E. In the specification and drawings, a reference numeral "B" may be referred to as a boundary B between the recess region E and the mesa region M. An upper surface of the mesa region M may be located higher than an upper surface of the recess region E (e.g., along the Z direction). According to an exemplary embodiment of the present inventive concept, the mesa region M may have a shape which gradually narrows from a bottom to a top. Thus, the mesa region M may have an inclined side surface.

According to an exemplary embodiment of the present inventive concept, a portion of an upper surface of the recess region E may be defined as a first contact region CT1. According to an exemplary embodiment of the present inventive concept, at least a portion of an upper surface of the mesa region M may be defined as a second contact region CT2.

The first transparent electrode layer 140 may be disposed on the second conductivity-type semiconductor layer 125 of the light emitting structure 110. The first transparent electrode layer 140 may be disposed on the second contact region CT2 of the second conductivity-type semiconductor layer 125 and may be electrically connected to the second conductivity-type semiconductor layer 125.

The first insulating layer 130 may be disposed on the first transparent electrode layer 140. The first insulating layer 130 may substantially cover a portion of the first conductivity-type semiconductor layer 115 and a portion of the second conductivity-type semiconductor layer 125. The first insulating layer 130 may include a plurality of holes PD located in the mesa region M. The first insulating layer 130 may partially cover the first transparent electrode layer 140 in the mesa region M. For example, the plurality of holes PD may be disposed in various forms such as a square grid form. A plurality of holes PD may have a circular cross section, by way of example, but exemplary embodiments of the present inventive concept not limited thereto. For example, the plurality of holes PD may have a polygonal or ring-shaped cross section. As an example, the plurality of holes PD may have a circular or polygonal shape when viewed from a plan view (e.g., along the Z direction).

In an exemplary embodiment of the present inventive concept, the first transparent electrode layer 140 may have a plurality of holes, misaligned or not overlapped with the plurality of holes PD. In this case, the first insulating layer 130 may substantially fill the plurality of holes of the first transparent electrode layer 140.

The first insulating layer 130 may include a material having a refractive index lower than that of the second conductivity-type semiconductor layer 125. The first insulating layer 130 may include at least one selected from, for example, $SiO_2$, SiN, $TiO_2$, HfO, or $MgF_2$. In an exemplary embodiment of the present inventive concept, the first insulating layer 130 may have a distributed Bragg reflector structure in which insulator films having different refractive indices are alternately and repeatedly stacked.

The second transparent electrode layer 142 may be disposed on the first insulating layer 130, and may be in direct contact with the first transparent electrode layer 140 through the plurality of holes PD.

The first transparent electrode layer 140 and the second transparent electrode layer 142 may each include at least one selected from indium tin oxide (ITO), zinc-doped indium tin oxide (ZITO), zinc indium oxide (ZIO), gallium indium oxide (GIO), zinc tin oxide (ZTO), fluorine-doped tin oxide (FTO), aluminium-doped zinc oxide (AZO), gallium-doped zinc oxide (GZO), $In_4Sn_3O_{12}$, or zinc magnesium oxide $(Zn_{(1-x)}Mg_xO, 0 \leq x \leq 1)$.

The reflective electrode layer 144 may be disposed on the second transparent electrode layer 142. The second transparent electrode layer 142 may increase adhesive properties between the reflective electrode layer 144 and the first insulating layer 130. The reflective electrode layer 144 may include silver (Ag), chromium (Cr), nickel (Ni), titanium (Ti), aluminum (Al), rhodium (Rh), ruthenium (Ru), or a combination thereof.

The transparent protective layer 138 may protect the reflective electrode layer 144 and may be disposed on and may substantially cover an upper surface and a side surface of the reflective electrode layer 144. The transparent protective layer 138 may be disposed on and may substantially cover a side surface of the second transparent electrode layer 142. The transparent protective layer 138 may include an upper portion R1 having a convex surface which may be disposed on and may substantially cover an upper surface of the reflective electrode layer 144. The transparent protective layer 138 may include a side portion R2 having an inclined surface which may be disposed on and may substantially cover a side surface of the reflective electrode layer 144 and a side surface of the second transparent electrode layer 142. The transparent protective layer 138 may be provided, thus increasing adhesive properties of the reflective electrode layer 144. Thus, an occurrence of migration of a metal element included in the reflective electrode layer 144 may be reduced or eliminated.

The first insulating layer 130, the second transparent electrode layer 142, and the reflective electrode layer 144 may form an omni-directional reflector. The omni-directional reflector increases reflectivity with respect to light, emitted from the active layer 120, thus increasing light extraction efficiency. In an exemplary embodiment of the present inventive concept, the second transparent electrode layer 142 may be omitted. In this case, the first insulating layer 130 and the reflective electrode layer 144 may form an omni-directional reflector.

The transparent protective layer 138 may include a transparent conductive material, or a transparent insulating material. The transparent conductive material may include at least one selected from indium tin oxide (ITO), zinc-doped indium tin oxide (ZITO), zinc indium oxide (ZIO), gallium indium oxide (GIO), zinc tin oxide (ZTO), fluorine-doped tin oxide (FTO), aluminium-doped zinc oxide (AZO), gallium-doped zinc oxide (GZO), $In_4Sn_3O_{12}$, or zinc magnesium oxide $(Zn_{(1-x)}Mg_xO, 0 \leq x \leq 1)$, or may include a conductive polymer. The transparent insulating material may include at least one selected from $SiO_2$, SiN, $TiO_2$, HfO, or $MgF_2$.

The second insulating layer 150 may be disposed on the transparent protective layer 138 and the first insulating layer 130.

A first opening OPa, passing through the first insulating layer 130 and the second insulating layer 150 to expose the first contact region CT1 of the first conductivity-type semiconductor layer 115, may be provided. When the transparent protective layer 138 includes a transparent insulating material, a second opening OPb, passing through the second insulating layer 150 and the transparent protective layer 138 to expose a third contact region CT3 of the reflective electrode layer 144, may be provided. The first opening OPa may be located in the recess region E, while the second opening OPb may be located in the mesa region M.

The first connecting electrode 155n may be disposed on the second insulating layer 150 and may be extended to the first contact region CT1 of the first conductivity-type semiconductor layer 115 through the first opening OPa to be electrically connected to the first conductivity-type semiconductor layer 115. The first connecting electrode 155n may be in direct contact with the first contact region CT1 of the first conductivity-type semiconductor layer 115. In an exemplary embodiment of the present inventive concept, to reduce contact resistance between the first connecting electrode 155n and the first contact region CT1 of the first conductivity-type semiconductor layer 115, a conductive buffer layer, may be disposed between the first connecting electrode 155n and the first contact region CT1 of the first conductivity-type semiconductor layer 115.

The second connecting electrode 155p may be disposed on the second insulating layer 150 and may be extended to the third contact region CT3 of the reflective electrode layer 144 through the second opening OPb to be electrically connected to the reflective electrode layer 144. Thus, the second connecting electrode 155p may be electrically connected to the second conductivity-type semiconductor layer 125 through the reflective electrode layer 144.

According to an exemplary embodiment of the present invention, when the transparent protective layer 138 includes a transparent conductive material, a second opening, passing through the second insulating layer 150 to expose a third contact region of the transparent protective layer 138, may be provided. The second connecting electrode 155p may be disposed on the second insulating layer 150 and may be electrically connected to the reflective electrode layer 144 through the second opening.

The first connecting electrode 155n and the second connecting electrode 155p may be disposed on the second insulating layer 150, may include a same material as each other, and may be spaced apart from each other. For example, the first connecting electrode 155n and the second connecting electrode 155p may each include a material including one or more of metals such as Al, Au, tungsten (W), platinum (Pt), silicon (Si), iridium (Ir), Ag, Cu, Ni, Ti, or Cr, or alloys thereof.

The third insulating layer 160 may have a third opening 160a exposing the first connecting electrode 155n and the second connecting electrode 155p. For example, the third opening 160a may expose a fourth contact region CT4 of the first connecting electrode 155n. The third insulating layer 160 may have a fourth opening 160b exposing a fifth contact region CT5 of the second connecting electrode 155p.

A first electrode pad 165n may be disposed on the fourth contact region CT4 of the first connecting electrode 155n, and a second electrode pad 165p may be disposed on the fifth contact region CT5 of the second connecting electrode 155p. A first bonding layer 170n may be disposed on the first electrode pad 165n, while a second bonding layer 170p may be disposed on the second electrode pad 165p. The first bonding pad 170n may be in direct contact with the first electrode pad 165n. The second bonding pad 170p may be in direct contact with the second electrode pad 165p. The first electrode pad 165n and the second electrode pad 165p may have a multilayer structure, in which a metal such as Ti, Ni, or Au is stacked. The first bonding layer 170n and the second bonding layer 170p may each include a conductive material such as Sn, or AuSn. In an exemplary embodiment of the present inventive concept, the first electrode pad 165n and the second electrode pad 165p may be omitted. In this case, the first bonding layer 170n and the second bonding layer 170p may be disposed on and may be in direct contact with the first connecting electrode 155n and the second connecting electrode 155p, respectively.

A molding portion 172, disposed on and substantially covering a side surface of each of the first bonding layer 170n and the second bonding layer 170p, may be provided. The molding portion 172 may include a resin (for example, silicone resin) including light reflective powder particles such as $TiO_2$, or $Al_2O_3$. An upper surface of the molding portion 172 may be substantially coplanar with upper surfaces of the first bonding layer 170n and the second bonding layer 170p, but exemplary embodiments of the present inventive concept are not limited thereto. An upper surface of the molding portion 172 may be located lower than upper surfaces of the first bonding layer 170n and the second bonding layer 170p. The first bonding layer 170n and the second bonding layer 170p may protrude relatively further, as compared with an upper surface of the molding portion 172.

According to an exemplary embodiment of the present inventive concept, the second transparent electrode layer 142 may be disposed between the reflective electrode layer 144 and the first insulating layer 130.

According to an exemplary embodiment of the present inventive concept, the second transparent electrode layer 142 may be in direct contact with the first transparent electrode layer 140 through a hole of the plurality of holes PD. For example, the hole of the plurality of holes PD may completely penetrate the first insulating layer 130 along a direction orthogonal to an upper surface of the second conductivity-type semiconductor layer 125, and thus the second transparent electrode layer 142 may come into direct contact with an upper surface of the first transparent electrode layer 140 through the hole of the plurality of holes PD.

According to an exemplary embodiment of the present inventive concept, an upper surface of the second transparent electrode layer 142 may be in direct contact with a bottom surface of the reflective electrode layer 144, and a bottom surface of the second transparent electrode layer 142 may be in direct contact with an upper surface of the first insulating layer 130.

FIGS. 9 to 16 are each plan views of a lead frame structure according to an exemplary embodiment of the present inventive concept.

Figure 9:
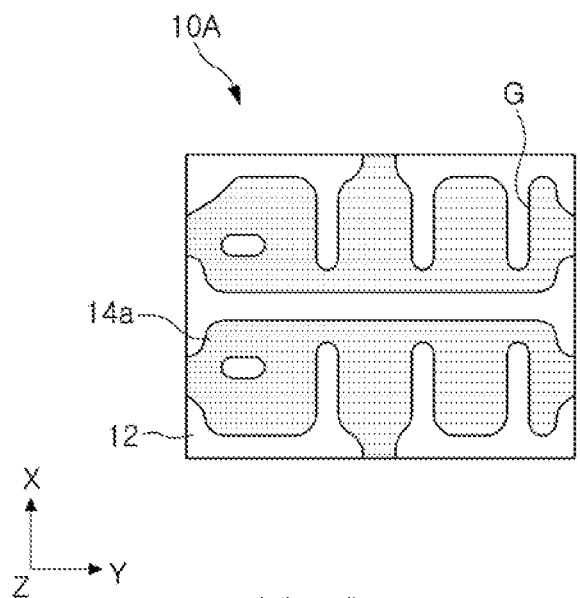
FIGS. 9 to 16 are each plan views of a lead frame structures according to an exemplary embodiment of the present inventive concept.

Referring to FIG. 9, in the case of a lead frame structure 10A, three grooves G of the lead frame 14a may be extended from an outer side surface of a lead frame 14a toward an inner side surface thereof.

Figure 10:
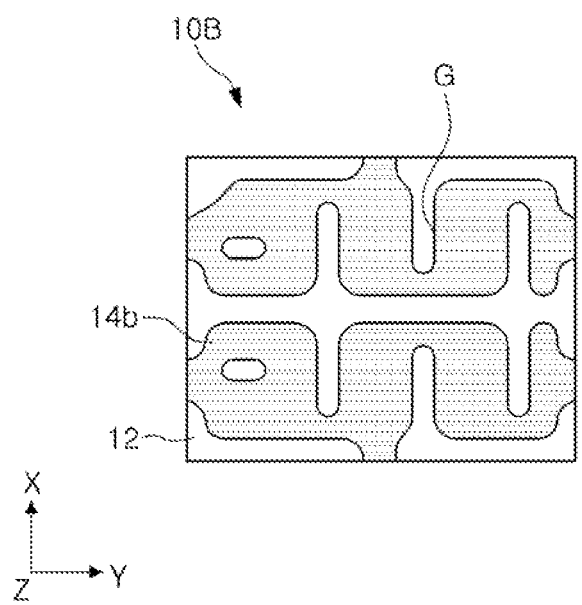
Figure 11:
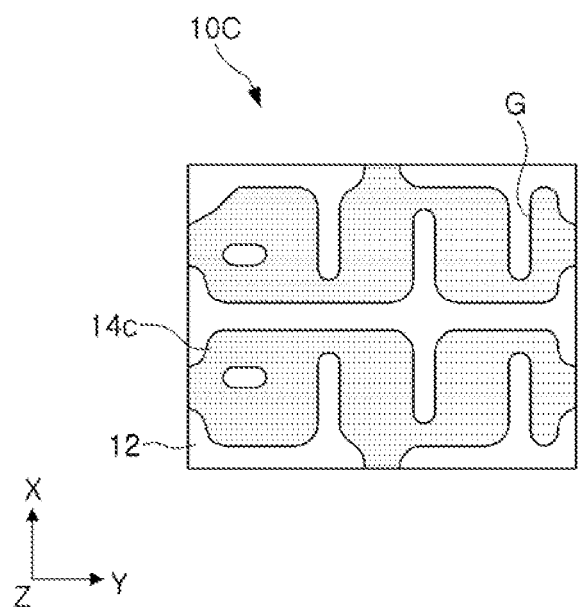

Referring to FIGS. 10 and 11, in the cases of lead frame structures 10B and 10C, at least one groove of the plurality of grooves G of the lead frames 14b and 14c may be extended from an outer side surface of the lead frames 14b and 14c toward an inner side surface thereof, and other grooves of the plurality of grooves G may be extended from the inner side surface of the lead frames 14b and 14c toward the outer side surface thereof.

As an example, in the case of the lead frame structure 10B of FIG. 10, a groove G, among three grooves G, located in the middle between two adjacent grooves, may be extended from an outer side surface of the lead frame 14b toward an inner side surface thereof. Alternatively, in the case of the lead frame structure 10C of FIG. 11, two grooves G among three grooves G, adjacent to the middle groove, may be extended from the outer side surface of the lead frame 14c toward the inner side surface thereof.

Figure 12:
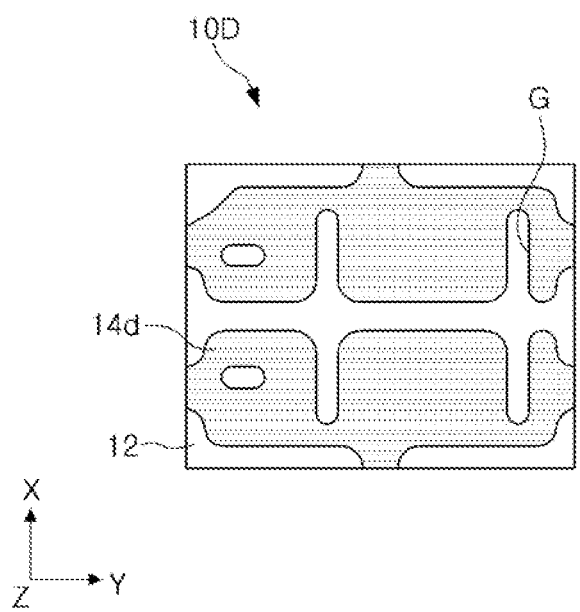

Referring to FIG. 12, in the case of a lead frame structure 10D, a lead frame 14d may include two grooves G. The lead frame 14d of FIG. 12 may have a structure in which a groove G, located substantially in the middle of the lead frame 14 (see, e.g., FIGS. 4 to 6), may be omitted.

Figure 13:
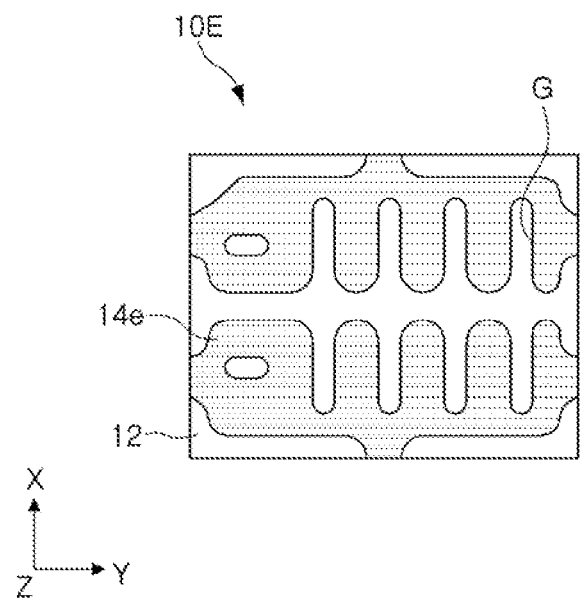

Referring to FIG. 13, in the case of a lead frame structure 10E, a lead frame 14e may include four grooves G. The lead frame 14e of FIG. 13 may include grooves G, disposed at intervals, narrower as compared with those illustrated in FIGS. 4 to 6. For example, the grooves G may be spaced apart from each other along the Y direction, but may be relatively closer together than the grooves G described with reference to FIGS. 4 to 6.

Figure 14:
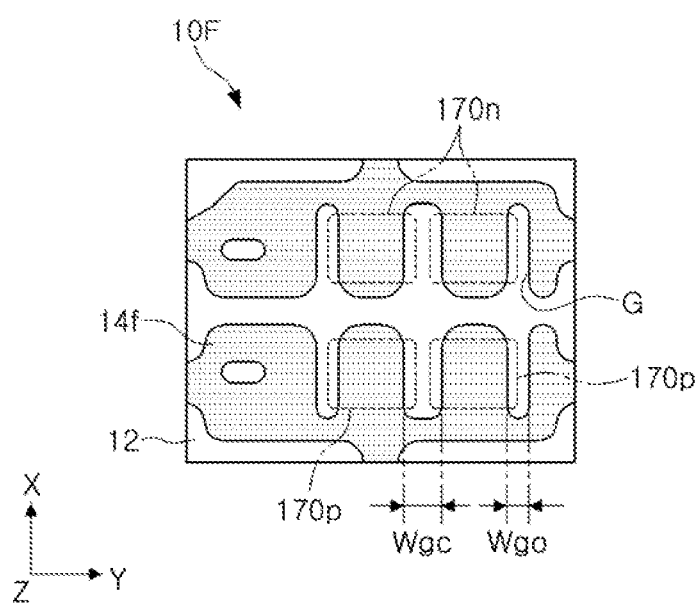

Referring to FIG. 14, in the case of a lead frame structure 10F, a width Wgc of a groove G (referred to as an intermediate groove G), located in the middle among the three grooves G, may be greater than a width Wgo of two grooves G (referred to as outer grooves G), located on opposite sides of the intermediate groove G. When a semiconductor light-emitting device 100, having been mounted, includes two first bonding layers 170n and two second bonding layers 170p, an intermediate groove G of each lead frame 14f may overlap adjacent edges of the two first bonding layers 170n, or may overlap adjacent edges of the two second bonding layers 170p.

According to a structure of the first bonding layer 170n and the second bonding layer 170p of the semiconductor light-emitting device 100, one of a pair of lead frames 14f may have an intermediate groove G having a greater width than the outer grooves G.

Figure 15:
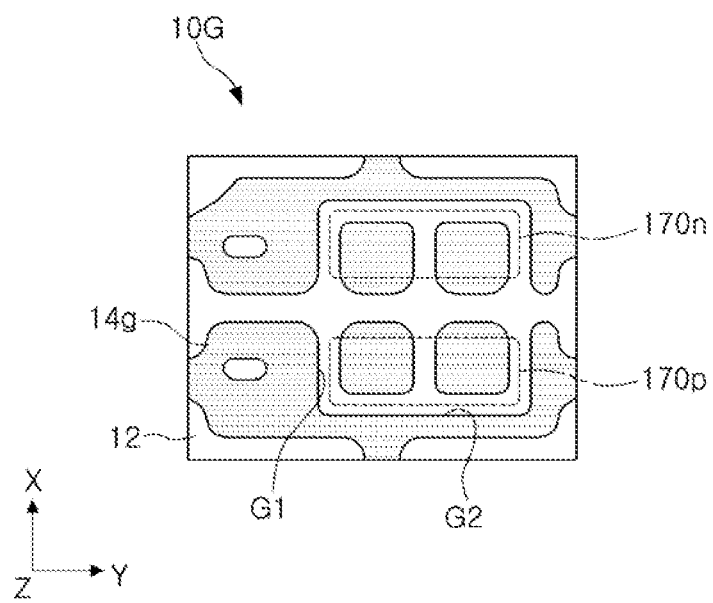

Referring to FIG. 15, in the case of a lead frame structure 10G, each lead frame 14g may have three first grooves G1 extended in a first direction (e.g., the X direction) and a second groove G2 extended in a second direction (e.g., the Y direction). The second groove G2 may be disposed to overlap ends of the first grooves G1.

When a semiconductor light-emitting device 100 is mounted in a lead frame 14g of FIG. 15, first edges of the bonding layers 170n and 170p, located at opposite ends in the second direction (e.g., the Y direction), may overlap first grooves G1 of the first grooves G1. Second edges of the bonding layers 170n and 170p, located at opposite ends in the first direction (the X direction), may overlap the second grooves G2.

Figure 16:
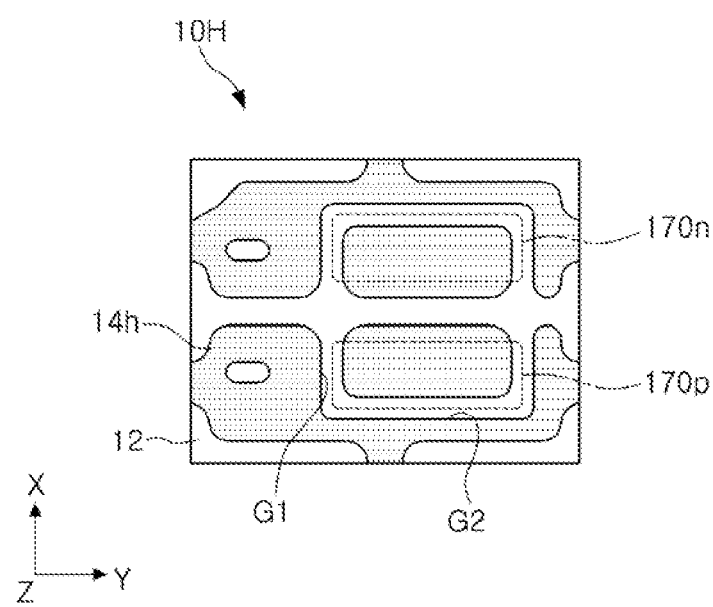

Referring to FIG. 16, in the case of a lead frame structure 10H, each lead frame 14h may have two first grooves G1 extended in a first direction (e.g., the X direction) and a second groove G2 extended in a second direction (the Y direction). The second groove G2 may be disposed to overlap ends of the first grooves G1.

When a semiconductor light-emitting device 100 is mounted in a lead frame 14h of FIG. 16, first edges of the bonding layers 170n and 170p, located at both ends in the second direction (the Y direction), may overlap the first grooves G1. Second edges of the bonding layers 170n and 170p, located at opposite ends in the first direction (e.g., the X direction), may overlap the second groove G2.

In an exemplary embodiment of the present inventive concept, the second groove G2, of FIGS. 15 and 16, may be applied to the lead frames of FIGS. 9 to 11, 13, and 14.

Figure 17:
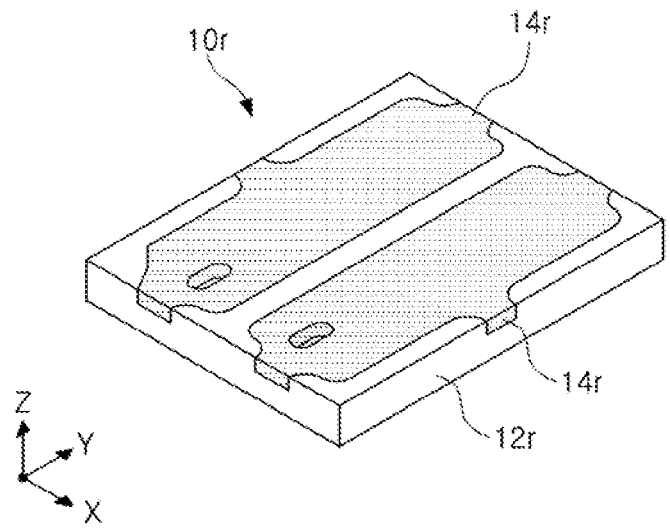
FIG. 17 is a perspective view of a lead frame structure according to an exemplary embodiment of the present inventive concept.

FIG. 17 is a perspective view of a lead frame structure according to an exemplary embodiment of the present inventive concept.

In FIG. 17, a lead frame structure 10r may include lead frames 14r not having grooves G and a resin portion 12r.

With respect to a semiconductor light emitting device package (comparative example), to which the lead frame structure 10r described with reference to FIG. 17 is applied, and a semiconductor light emitting device package 1 according to an exemplary embodiment of the present inventive concept, to which the lead frame structure 10 described with reference to FIG. 4 is applied, a thermal stress simulation (e.g., at a temperature range from −45° C. to 125° C.) may be performed. In the semiconductor light emitting device package 1 according to an exemplary embodiment of the present inventive concept, as compared with a comparative example, it may be determined that thermal stress applied to a semiconductor light-emitting device is reduced by about 36%. In the semiconductor light emitting device package 1, according to an exemplary embodiment of the present inventive concept, lead frames 14 having a plurality of grooves G may be applied, and thus stress applied to a semiconductor light-emitting device, can be dispersed and reduced.

A semiconductor light emitting device package according to an exemplary embodiment of the present invention having grooves as described herein may have relatively high reliability because thermal stress due to a difference in thermal expansion coefficient between a lead frame structure and a semiconductor light-emitting device may be reduced or eliminated, and relatively low manufacturing costs. Thus, a semiconductor light emitting device package according to an exemplary embodiment of the present inventive concept may be applied to a field requiring relatively high reliability, such as automotive lamp, or relatively high power LED lighting.

Figure 18:
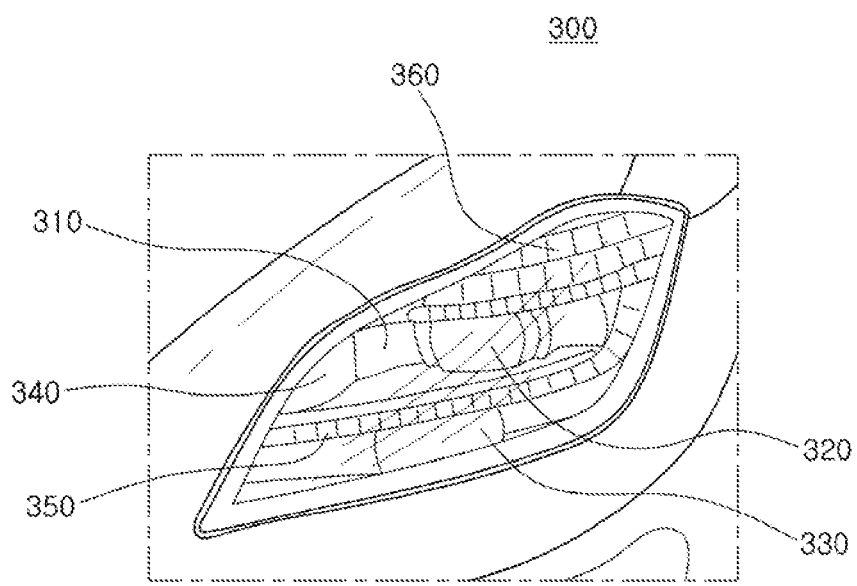
FIG. 18 is a view of a head lamp for a vehicle according to an exemplary embodiment of the present inventive concept.

FIG. 18 is a view of a head lamp for a vehicle according to an exemplary embodiment of the present inventive concept.

Referring to FIG. 18, a head lamp for a vehicle 300 according to an exemplary embodiment of the present inventive concept may have a plurality of light sources emitting light for different purposes. The head lamp for a vehicle 300 may include light sources, such as low beam headlamps 310 and 320, high beam headlamps 330, cornering lights 340, daytime running lights (DRL) 350 and turn signal lamps 360. A semiconductor light emitting device package according to an exemplary embodiment of the present inventive concept may be applied to each of the light sources 310, 320, 330, 340, 350 or 360.

A semiconductor light emitting device package according to an exemplary embodiment of the present inventive concept may be applied to light sources such as a stop lamp, a tail lamp, a back up lamp or a turn signal lamp, which may be included in a rear combination lamp for a vehicle.

Figure 19:
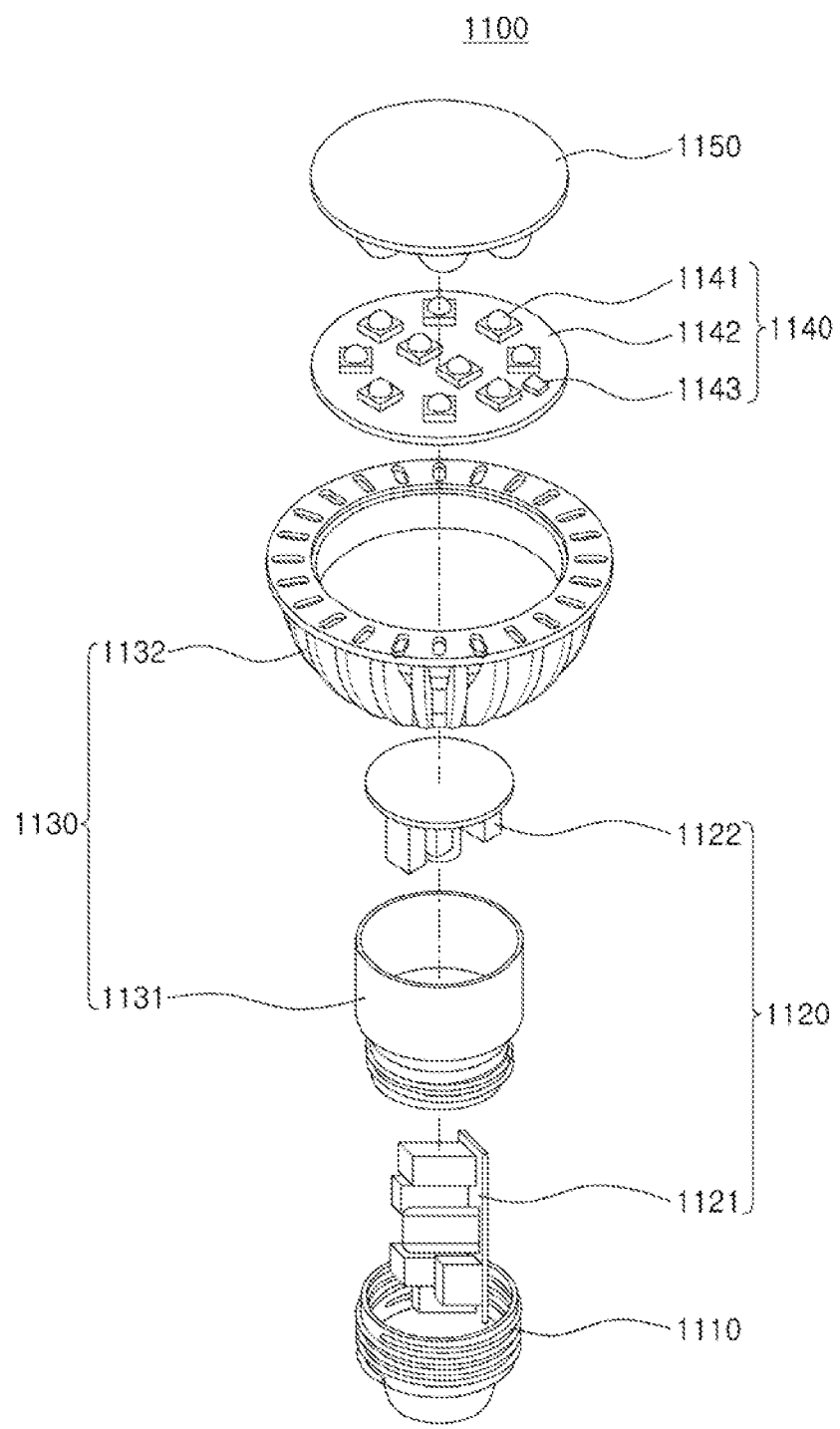
FIG. 19 is an exploded perspective view of a bulb-type lamp according to an exemplary embodiment of the present inventive concept.

FIG. 19 is an exploded perspective view of a bulb-type lamp according to an exemplary embodiment of the present inventive concept.

A lighting device 1100 of FIG. 19 may include a socket 1110, a power supply 1120, a heat sink 1130, a light source module 1140, and an optical portion 1150.

The socket 1110 may be configured to replace that of a conventional lighting device. Power supplied to the lighting device 1100 may be applied through the socket 1110. The power supply 1120 may include a first power supply 1121 and a second power supply 1122. The heat sink 1130 may include an internal heat sink 1131 and an external heat sink 1132, and the internal heat sink 1131 may be directly connected to the light source module 1140 and/or the power supply 1120, thus transferring heat to the external heat sink 1132. The optical portion 1150 may be configured to evenly scatter light emitted by the light source module 1140.

The light source module 1140 may receive power from the power supply 1120 to emit light to the optical portion 1150. The light source module 1140 may include one or more light sources 1141, a circuit board 1142, and a controller 1143, and the controller 1143 may store driving information of the light sources 1141. The semiconductor light emitting device package according to an exemplary embodiment of the present inventive concept may be applied to the light source 1141.

The lighting device 1100 may further include a communications module, and home-network communications may be implemented through the communications module. For example, the communications module may a wireless communications module using Zigbee®, wireless fidelity (Wi-Fi), or light fidelity (Li-Fi), and may control on/off functions and brightness of a lighting apparatus installed in and around the home through a smartphone or wireless controller.

Provided herein is a semiconductor light emitting device package with relatively low manufacturing costs and increased reliability.

While the present inventive concept has been shown and described with reference to the exemplary embodiments thereof, it will be apparent to those of ordinary skill in the art that various changes in form and detail may be made thereto without departing from the spirit and scope of the present inventive concept.

What is claimed is:

1. A semiconductor light emitting device package, comprising:
   a lead frame, structure including a first lead frame and a second lead frame, and a resin portion adjacent to side surfaces of the first lead frame and the second lead frame, and
   a semiconductor light-emitting device mounted on the first lead frame and the second lead frame, in the form of a flip chip,
   wherein each of the first lead frame and the second lead frame has a plurality of first grooves extended in a first direction,
   wherein the resin portion that is adjacent to the side surfaces of the first lead frame fills the plurality of first grooves,
   wherein an upper surface of the first lead frame is coplanar with an upper surface of the second lead frame and an upper surface, of the resin portion, and
   wherein a lower surface of the semiconductor light-emitting device is a single surface that is flat against the upper surface of the first lead frame, the upper surface of the second lead frame, and the upper surface of the resin portion.

2. The semiconductor light emitting device package of claim 1, wherein the semiconductor light-emitting device is mounted to overlap at least a portion of the plurality of first grooves.

3. The semiconductor light emitting device package of claim 1, wherein each of the first lead frame and the second lead frame has an upper region and a lower region, having different widths from each other, and the plurality of first grooves are formed in the upper region.

4. The semiconductor light emitting device package of claim 3, wherein a depth of the plurality of first grooves is equal to a thickness of the upper region.

5. The semiconductor light emitting device package of claim 1, wherein the plurality of first grooves are extended from an inner side surface toward an outer side surface of the first lead frame and the second lead frame in the first direction.

6. The semiconductor light emitting device package of claim 1, wherein the plurality of first grooves are extended from a outer side surface to an inner side surface of the first lead frame and the second lead frame in the first direction.

7. The semiconductor light emitting device package of claim 1, wherein a at least one first groove of the plurality of first grooves is extended from an inner side surface toward an outer side surface of the first lead frame and the second lead frame in the first direction, and wherein at least one other first groove of the plurality of first grooves is extended from the outer side surface toward the inner side surface of the first lead frame and the second lead frame in the first direction.

8. The semiconductor light emitting device package of claim 1, wherein at least one first groove of the plurality of first grooves has a first width, and wherein at least one other first groove of the plurality of first grooves has a second width, different from the first width.

9. The semiconductor light emitting device package of claim 1, wherein the first lead frame and the second lead frame have a second groove, intersecting the plurality of first grooves, and extended in a second direction, perpendicular to the first direction.

10. The semiconductor light emitting device package of claim 1, wherein lower surfaces of the first lead frame and the second lead frame and a lower surface of the resin portion are coplanar with each other.

11. The semiconductor light emitting device package of claim 1, wherein the resin portion includes a silicon molding compound.

12. The semiconductor light emitting device package of claim 1, wherein the semiconductor light-emitting device includes:
a light emitting structure including a first conductivity-type semiconductor layer, an active layer, and a second conductivity-type semiconductor layer;
a first transparent electrode layer disposed on the second conductivity-type semiconductor layer;
a first insulating layer disposed on the first transparent electrode layer, and having a plurality of holes;
a reflective electrode layer disposed on the first insulating layer, and connected to t first transparent electrode layer through the plurality of holes;
a transparent protective layer disposed on an upper surface and a side surface of the reflective electrode layer, and disposed on a region of the first insulating layer; and a first bonding layer and a second bonding layer electrically connected to the first conductivity-type semiconductor layer and the second conductivity-type semiconductor layer, respectively.

13. The semiconductor light emitting device package of claim 12, wherein the first bonding layer and the second bonding layer include a gold-tin (AuSn) alloy.

14. The semiconductor light emitting device package of claim 12, wherein edges of the first bonding layer and edges of the second bonding layer have a portion overlapping at least a portion of the first grooves.

15. A semiconductor light emitting device package, comprising:
a lead frame structure including a first lead frame and a second lead frame, and a resin portion adjacent to side surfaces of the first lead frame and the second lead frame;
a semiconductor light-emitting device mounted on the lead frame structure, in the form of a flip chip, and including a first bonding layer and a second bonding layer, connected to the first lead frame and the second lead frame, respectively;
a phosphor layer disposed on an upper surface of the semiconductor light-emitting device; and
an encapsulation portion disposed on a side surface of the phosphor layer and a side surface of the semiconductor light-emitting device, and disposed on the lead frame structure, wherein each of the first lead frame and the second lead frame has a plurality of first grooves extended in-parallel with each other in a first direction,
wherein the resin portion that is adjacent to the side surfaces of the first lead frame and the second lead frame fills the plurality of first grooves of the first lead frame and the second lead frame,
wherein an upper surface of the first lead frame is coplanar with an upper surface of the second lead frame and an upper surface of the resin portion, and
wherein a lower surface of the semiconductor light-emitting device is a single surface that is flat against the upper surface of the first lead flame, the upper surface of the second lead frame, and the upper surface of the resin portion.

16. The semiconductor light emitting device package of claim 15, wherein at least one of the plurality of first grooves is extended from an inner side surface toward an outer side surface of the first lead frame and the second lead frame in the first direction, and wherein an extension length of the plurality of first grooves is less than a width of the first lead frame and the second lead frame.

17. The semiconductor light emitting device package of claim 15, wherein edges of the first bonding layer and the second bonding layer have a portion overlapping at least a portion of the first grooves.

18. The semiconductor light emitting device package of claim 15, wherein each of the first lead frame and the second lead frame has a second groove intersecting the plurality of first grooves, and extended in a second direction, perpendicular to the first direction.

19. The semiconductor light emitting device package of claim 18, wherein ethics of the first bonding layer and the second bonding layer have a portion, overlapping at least a portion of the first grooves, and the second groove.

20. A semiconductor light emitting device package, comprising:
- a lead frame structure including a first lead frame and a second lead frame, and a resin portion disposed on side surfaces of the first lead frame and the second lead frame;
- a semiconductor light-emitting device mounted on the lead frame structure, in the form of a flip chip, and including a first bonding layer and a second bonding layer in contact with the first lead frame and the second lead frame, respectively;
- a phosphor layer disposed on an upper surface of the semiconductor light-emitting device; and
- an encapsulation portion disposed on a side surface of the phosphor layer and a side surface of the semiconductor light-emitting device, and disposed on the lead frame structure,
- wherein each of the first lead frame and the second lead frame has a plurality of first grooves extended in-parallel with each other in a first direction, the resin portion that is disposed on the side surfaces of the first lead frame fills the plurality of first grooves, and the resin portion includes a silicon molding compound,
- wherein an upper surface of the first lead frame is coplanar with an upper surface of the second lead frame and an upper surface of the resin portion, and
- wherein a lower surface of the semiconductor light-emitting device is a single surface that is flat against the upper surface of the first lead frame, the upper surface of the second lead frame, and the upper surface of the resin portion.

* * * * *